(12) United States Patent
Furuya

(10) Patent No.: US 6,504,720 B2
(45) Date of Patent: Jan. 7, 2003

(54) COOLING UNIT FOR COOLING HEAT GENERATING COMPONENT, CIRCUIT MODULE INCLUDING THE COOLING UNIT, AND ELECTRONIC APPARATUS MOUNTED WITH THE CIRCUIT MODULE

(75) Inventor: Keizo Furuya, Hino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/955,045

(22) Filed: Sep. 19, 2001

(65) Prior Publication Data

US 2002/0036890 A1 Mar. 28, 2002

(30) Foreign Application Priority Data

Sep. 25, 2000 (JP) ........................................ 2000-291291

(51) Int. Cl.⁷ ................................................ H05K 7/20
(52) U.S. Cl. ....................... 361/699; 361/689; 361/698; 361/700; 361/704; 361/707; 361/719; 257/714; 257/715; 174/15.1; 174/15.2; 165/80.4; 165/104.33; 165/185
(58) Field of Search ................................ 361/689, 690, 361/694–699, 700, 703, 704; 257/706, 714, 715, 721, 722; 174/15.1, 15.2, 16.1, 16.3; 165/80.3, 80.4, 104.33, 122

(56) References Cited

U.S. PATENT DOCUMENTS 4,072,188 A * 2/1978 Wilson et al. ................. 165/80
5,006,924 A * 4/1991 Frankeny et al. ............ 257/714
5,150,274 A * 9/1992 Okada et al. ................ 361/703
5,198,889 A * 3/1993 Hisano et al. ............... 257/678
5,305,184 A * 4/1994 Andresen et al. ........... 361/699
5,323,292 A * 6/1994 Brzezinski ................... 361/689
6,019,165 A * 2/2000 Batchelder .................. 165/80.3
6,062,299 A * 5/2000 Choo et al. .................... 165/46
6,324,058 B1 * 11/2001 Hsiao .......................... 361/699

FOREIGN PATENT DOCUMENTS

| JP | 57-211258 | 12/1982 | | |
| JP | 60-83254 | 5/1985 | | |
| JP | 64-19754 | 1/1989 | | |
| JP | 402007456 A * | 1/1990 | ................. | 257/714 |

* cited by examiner

Primary Examiner—Boris Chervinsky
(74) Attorney, Agent, or Firm—Finnegan, Henderson, Farabow, Garrett & Dunner, L.L.P.

(57) ABSTRACT

A cooling unit has a vessel that is filled with a refrigerant. The vessel includes a heat receiving portion for receiving heat from a heat generating component, a heat dissipating portion for dissipating the heat from the heat generating component, and a heat transfer portion for transferring the heat transmitted to the heat receiving portion to the heat dissipating portion via a refrigerant. At least the heat receiving portion of the vessel is formed of a soft heat conduction sheet that receives the heat from the heat generating component. The heat conduction sheet is directly in contact with the heat generating component.

13 Claims, 8 Drawing Sheets

COOLING UNIT FOR COOLING HEAT GENERATING COMPONENT, CIRCUIT MODULE INCLUDING THE COOLING UNIT, AND ELECTRONIC APPARATUS MOUNTED WITH THE CIRCUIT MODULE

CROSS-REFERENCE TO RELATED APPLICATIONS

This application is based upon and claims the benefit of priority from the prior Japanese Patent Application No. 2000-291291, filed Sep. 25, 2000, the entire contents of which are incorporated herein by reference.

BACKGROUND OF THE INVENTION

1. Field of the Invention

The present invention relates to a cooling unit used to cool a heat generating component such as a semiconductor package, a circuit module including the cooling unit, and an electronic apparatus such as a portable computer mounted with the circuit module.

2. Description of the Related Art

An electronic apparatus such as a portable computer is furnished with an MPU (Micro Processing Unit) for processing multimedia information, including text, speech, and animations. The amount of heat released from the MPU of this type tends to increase rapidly during operation as its processing speed and the number of its functions increases. In order to ensure stable operation of the MPU, therefore, the heat radiating properties of the MPU must be improved. To attain this, the MPU requires use of a radiating component such as a heat pipe for discharging its heat to the outside.

A conventional heat pipe has an outer pipe in which a liquid refrigerant is sealed. The outer pipe is formed of a hard metallic material. Thus, if the heat pipe is directly affixed to the MPU, it cannot enjoy good adhesion to the MPU, so that heat from the MPU cannot be efficiently transmitted to the heat pipe. Conventionally, therefore, a soft heat conduction sheet or thermally conductive grease is sandwiched between the MPU and the heat pipe.

The heat conduction sheet is formed of a soft rubberlike elastic body having high heat conductivity. When the MPU and the heat pipe are connected thermally to each other, the heat conduction sheet is deformed so as to compensate for lowering of the heat conductivity that is attributable to the surface roughness of the two elements or absorb a gap that hinders heat conduction. In consequence, the thermal resistance of a thermal junction between the MPU and the heat pipe is lowered, so that the heat from the MPU can be efficiently transmitted to the heat pipe.

According to the conventional arrangement, however, the heat from the MPU is transferred to the refrigerant in the outer pipe after it is transmitted from the heat conduction sheet to the outer pipe. Accordingly, the outer pipe and the heat conduction sheet are inevitably interposed between the MPU as a heat source and the refrigerant that receives the heat, and cause a heat transfer loss. In consequence, the quantity of heat that can be transmitted from the MPU to the refrigerant is limited.

Higher-speed multifunctional versions of MPUs for portable computers are expected to be developed in the near future, and the amount of heat released from the MPUs is supposed to increase considerably. According to the conventional structure for thermal connection that uses the heat conduction sheet, therefore, there is a possibility that the cooling performance of the MPUs satisfactory or is limited. Thus, in consideration of the increase in the heat release value of modern MPUs, the rate of conduction of heat from the MPU is not to the refrigerant must be improved.

BRIEF SUMMARY OF THE INVENTION

The present invention has been contrived in consideration of these circumstances, and its object is to provide a cooling unit, circuit module, and electronic apparatus, designed so that heat from a heat generating component can be efficiently transmitted to a refrigerant and the cooling performance of the heat generating component can be improved.

In order to achieve the above object, a cooling unit according to a first aspect of the present invention comprises a vessel filled with a refrigerant. The vessel includes a heat receiving portion for receiving heat from a heat generating component, a heat dissipating portion for dissipating the heat from the heat generating component, and a heat transfer portion for transferring the heat from the heat generating component, transmitted to the heat receiving portion, to the heat dissipating portion via the refrigerant. That part of at least the heat receiving portion of the vessel which receives the heat from the heat generating component is formed of a soft heat conduction sheet capable of elastic deformation, the heat conduction sheet being directly in contact with the heat generating component.

In order to achieve the above object, a cooling unit according to a second aspect of the invention comprises a heat receiving portion for receiving heat from a heat generating component, a heat dissipating portion for dissipating the heat from the heat generating component, and a heat transfer portion for circulating a refrigerant between the heat receiving portion and the heat dissipating portion and transferring the heat from the heat generating component, transmitted to the heat receiving portion, to the heat dissipating portion via the refrigerant. That part of at least the heat receiving portion which receives the heat from the heat generating component is formed of a soft heat conduction member capable of elastic deformation, the heat conduction member being directly in contact with the heat generating component.

In order to achieve the above object, an electronic apparatus according to a third aspect of the invention comprises a housing having a heat generating component therein and a cooling unit held in the housing. The cooling unit includes a heat receiving portion for receiving heat from the heat generating component, a heat dissipating portion for dissipating the heat from the heat generating component, and a heat transfer portion for transferring the heat from the heat generating component, transmitted to the heat receiving portion, to the heat dissipating portion via a refrigerant. That part of at least the heat receiving portion of the cooling unit which receives the heat from the heat generating component is formed of a soft heat conduction sheet capable of elastic deformation, the heat conduction sheet being directly in contact with the heat generating component.

According to this arrangement, the soft heat conduction sheet can be deformed into any desired shape. Therefore, it can adhere to the heat generating component so as to compensate for lowering of the heat conductivity that is attributable to the surface roughness of the heat generating component or absorb a gap that hinders heat conduction. Accordingly, only the heat conduction sheet is interposed between the heat generating component and the refrigerant, so that the thermal resistance of a heat conduction path that extends from the heat generating component to the refrigerant can be lowered. Thus, the heat transmitted from the heat generating component to the heat conduction sheet can be efficiently transferred to the refrigerant.

In order to achieve the above object, a cooling unit according to a fourth aspect of the invention comprises a thermally conductive main body including a heat receiving portion for receiving heat from a heat generating component and a heat dissipating portion connected thermally to the heat receiving portion, a fan for supplying cooling air to the heat dissipating portion, and a refrigerant passage in the main body for moving a liquid refrigerant between the heat receiving portion and the heat dissipating portion. The refrigerant passage transfers the heat from the heat generating component, transmitted to the heat receiving portion, to the heat dissipating portion via the refrigerant. That part of the refrigerant passage which corresponds to the heat receiving portion is formed of a soft heat conduction sheet capable of elastic deformation. The heat conduction sheet is directly in contact with the heat generating component.

In the arrangement described above, the heat transmitted from the heat generating component to the heat receiving portion is diffused by heat conduction to the heat dissipating portion and transferred from the heat receiving portion to the refrigerant in the refrigerant passage. Since the heat dissipating portion is compulsorily cooled with the cooling air, there is a great difference in temperature between the heat dissipating and receiving portions. Thus, the refrigerant heated in the heat receiving portion is reduced vapor and flows through the refrigerant passage toward the heat dissipating portion. Then, the vapor is condensed by heat exchange in the heat dissipating portion. The refrigerant that is liquefied by this condensation is returned through the refrigerant passage to the heat receiving portion by capillarity and subjected again to the heat from the heat generating component. By repeating this cycle, the heat from the heat generating component can be transferred from the heat receiving portion to the heat dissipating portion and emitted from the heat dissipating portion.

According to this arrangement, the soft heat conduction sheet can be deformed into any desired shape. Therefore, it can adhere to the heat generating component so as to compensate for lowering of the heat conductivity that is attributable to the surface roughness of the heat generating component or absorb a gap that hinders heat conduction. Accordingly, only the heat conduction sheet is interposed between the heat generating component and the refrigerant, so that the thermal resistance of a heat conduction path that extends from the heat generating component to the refrigerant c a n be lowered. Thus, the heat transmitted from the heat generating component to the heat conduction sheet can be efficiently transferred to the refrigerant.

In order to achieve the above object, a circuit module according to a fourth aspect of the invention comprises a circuit board having a mounting surface, a heat generating component mounted on the mounting surface of the circuit board, and a cooling unit for cooling the heat generating component. The cooling unit includes a heat receiving portion for receiving heat from the heat generating component, a heat dissipating portion for dissipating the heat from the heat generating component, and a heat transfer portion for transferring the heat from the heat generating component, transmitted to the heat receiving portion, to the heat dissipating portion via a refrigerant. That part of at least the heat receiving portion of the cooling unit which receives the heat from the heat generating component is formed of a soft heat conduction sheet capable of elastic deformation. The heat conduction sheet has an outer peripheral portion projecting around the heat generating component, the outer peripheral portion being directly in contact with the mounting surface of the circuit board.

According to this arrangement, the soft heat conduction sheet can be deformed into any desired shape. Therefore, it can adhere to the heat generating component so as to compensate for lowering of the heat conductivity that is attributable to the surface roughness of the heat generating component or absorb a gap that hinders heat conduction. Accordingly, only the heat conduction sheet is interposed between the heat generating component and the refrigerant, so that the thermal resistance of a heat conduction path that extends from the heat generating component to the refrigerant can be lowered. Thus, the heat transmitted from the heat generating component to the heat conduction sheet can be efficiently transferred to the refrigerant.

Besides, the outer peripheral portion of the heat conduction sheet is deformed and adheres to the mounting surface of the circuit board so as to fill the gap between the outer peripheral edge of the heat generating component and the mounting surface when the refrigerant is expanded by the heat from the heat generating component. Therefore, some of the heat delivered from the heat generating component to the circuit board can be transferred directly to the refrigerant through the heat conduction sheet. In consequence, much of the heat from the heat generating component can be absorbed efficiently, and temperature increase of the circuit board can be restrained.

In order to achieve the above object, a circuit module according to a sixth aspect of the invention comprises a heat generating component and a cooling unit for cooling the heat generating component. The cooling unit includes a heat receiving portion for receiving heat from the heat generating component, a heat dissipating portion for dissipating the heat from the heat generating component, and a pipeline for transferring the heat from the heat generating component, transmitted to the heat receiving portion, to the heat dissipating portion via a refrigerant. The heat receiving portion of the cooling unit is formed of a soft heat conduction pouch capable of elastic deformation and having a socket at one end thereof to which the pipeline is connected, the heat conduction pouch being directly in contact with the heat generating component.

According to this arrangement, the heat receiving portion is smoothly elastically deformed following the shape of the heat generating component and adheres to the heat generating component so as to absorb a gap that hinders heat conduction. Therefore, the heat transmitted from the heat generating component to the heat receiving portion can be transferred directly to the refrigerant. Thus, the thermal resistance of a heat conduction path that extends from the heat generating component to the refrigerant can be lowered, and the heat from the heat generating component can be efficiently transferred to the refrigerant.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A portable computer according to a first embodiment of present invention will now be described with reference to the accompanying drawings of FIGS. 1 to 6.

Figure 1:
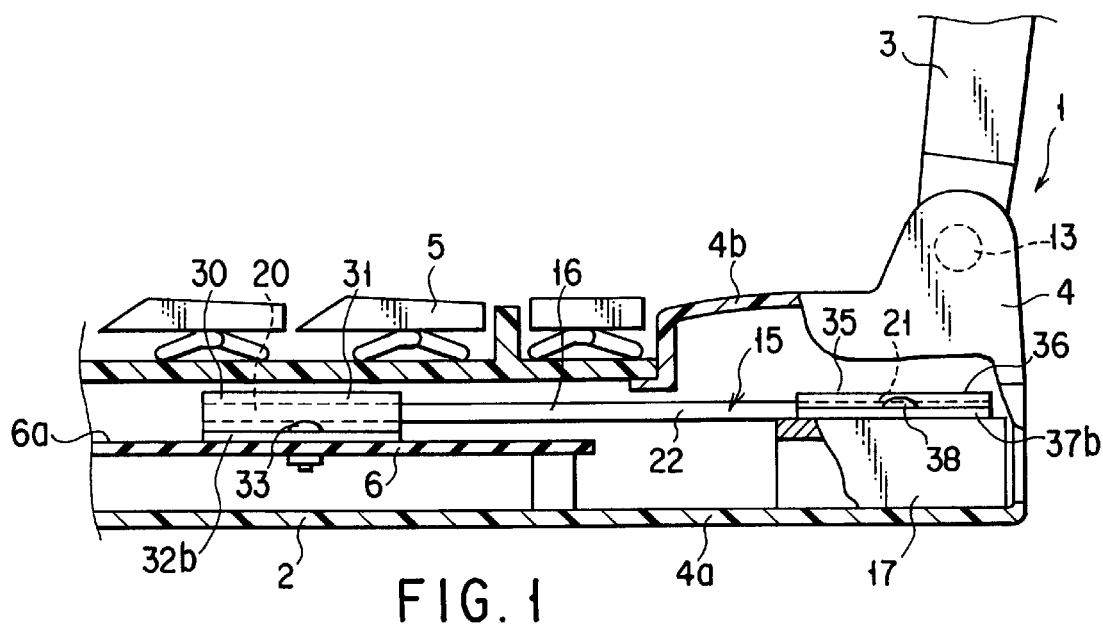
FIG. 1 is a sectional view of a portable computer according to a first embodiment of the present invention.

As shown in FIG. 1, a portable computer 1 comprises a computer body 2 and a display unit 3 supported thereon. The computer body 2 includes a housing 4. The housing 4 is in the form of a flat box that has a bottom wall 4a and a top wall 4b, and a keyboard 5 is set on the top wall 4b of the housing 4. The display unit 3 is rockably supported on the rear end portion of the housing 4 by means of a hinge device 13.

The housing 4 has a circuit board 6 therein. The circuit board 6 is supported on the bottom wall 4a of the housing 4 and extends horizontally along the bottom wall 4a. A BGA-type semiconductor package 7 for use as a heat generating component is mounted on a mounting surface 6a of the circuit board 6. The semiconductor package 7 constitutes an MPU (micro processing unit) that serves as the pivot of the portable computer 1.

Figure 2:
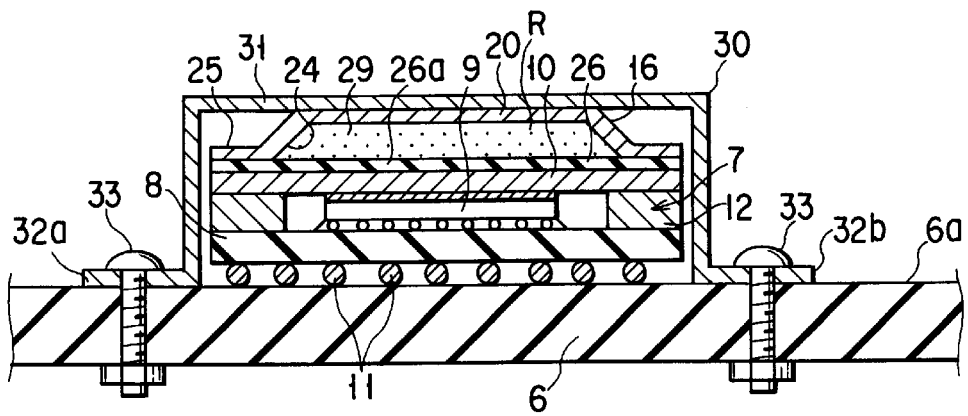
FIG. 2 is a sectional view of a cooling unit according to the first embodiment, showing a thermal junction between a semiconductor package and a heat pipe.
Figure 3:
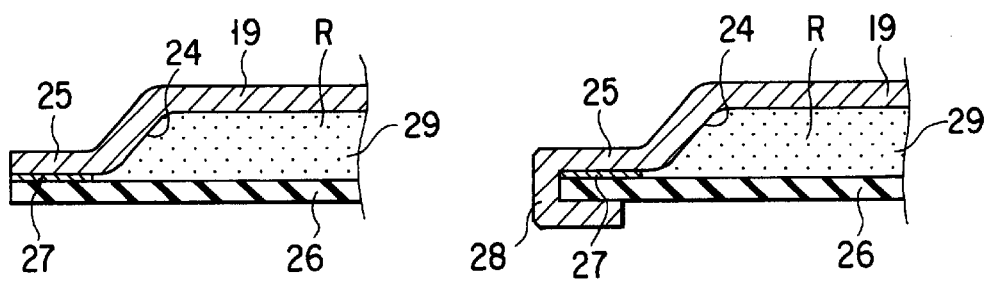
FIG. 3 is a sectional view of the heat pipe according to the first embodiment, showing a joint structure for a vessel and a heat conduction sheet.

As shown in FIG. 2, the semiconductor package 7 includes a base plate 8, an IC chip 9 mounted on the base plate 8, and a cover plate 10 that covers IC chip 9. The base plate 8 is soldered to the mounting surface 6a of the circuit board 6 by means of a large number of solder balls 11. The power consumption of IC chips 9 is increased with the development of higher-speed multifunctional versions. As this is done, the heat release value of the IC chips becomes so large that they require cooling. The cover plate 10 is formed of a metallic material with high heat conductivity. The plate 10 is fixed to the base plate 8 by means of a spacer 12. The IC chip 9 is sandwiched between the plates 8 and 10.

When the IC chip 9 generates heat, therefore, the heat from the chip 9 is transmitted to the cover plate 10 and also to the circuit board 6 through the base plate 8 and the solder balls 11.

As shown in FIG. 1, the housing 4 has a cooling unit 15 therein. The cooling unit 15, which serves to cool the semiconductor package 7, is provided with a heat pipe 16 and a heat sink 17.

Figure 5:
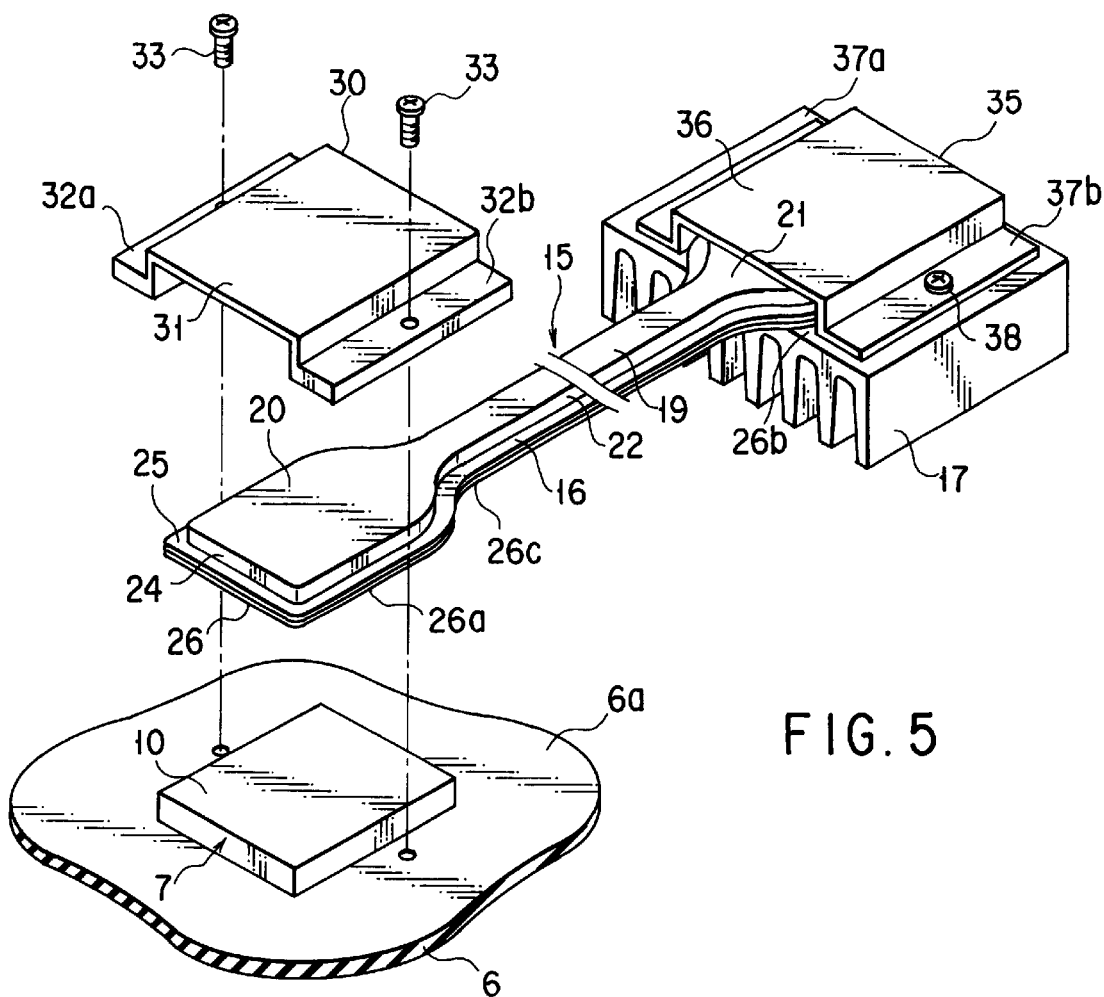
FIG. 5 is an exploded perspective view of the cooling unit according to the first embodiment, showing the positional relationship between a heat receiving portion of the heat pipe and the semiconductor package.
Figure 6:
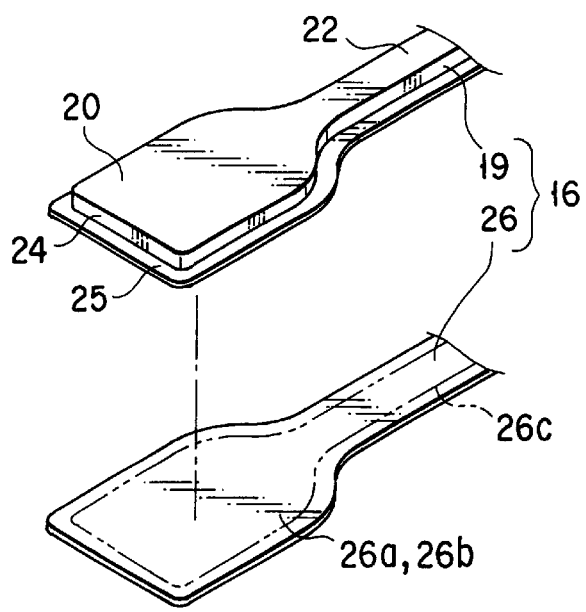
FIG. 6 is a perspective view of the heat pipe according to the first embodiment, showing the positional relationship between the vessel and the heat conduction sheet.

As shown in FIG. 5, the heat pipe 16 is composed of an elongated vessel 19 and a heat conduction sheet 26. The vessel 19 is formed of a thin metal sheet of, for example, aluminum alloy having high heat conductivity. The vessel 19 includes a heat receiving portion 20, a heat dissipating portion 21, and a heat transfer portion 22. The heat receiving and dissipating portions 20 and 21 are spaced in the longitudinal direction of the vessel 19. The heat transfer portion 22 connects the portions 20 and 21 in a straight line. The portions 20 and 21 are wider than the portion 22. The respective plane configuration of the heat receiving and dissipating portions 20 and 21 conform to that of the semiconductor package 7.

The vessel 19 has a recess 24 in its central portion. The recess 24 is formed by drawing the vessel 19. The recess 24 extends covering the overall length of the vessel 19 and opens downward with respect to the vessel 19. A flat flange portion 25 is formed on the outer peripheral edge portion of the recess 24. The flange portion 25 extends throughout the circumference of the vessel 19.

The heat conduction sheet 26 is formed of a soft rubber-like elastic body that is loaded with a filler having high heat conductivity, for example. The thickness of the sheet 26 is adjusted to about 0.1 to 1 mm. The heat conduction sheet 26 includes a first end portion 26a, a second end portion 26b, and an intermediate portion 26c. The first end portion 26a has a size corresponding to that of the heat receiving portion 20. The second end portion 26b has a size corresponding to that of the heat dissipating portion 21. The intermediate portion 26c has a size corresponding to that of the heat transfer portion 22. Thus, the first and second end portions 26a and 26b are spaced in the longitudinal direction of the vessel 19 and are wider than the intermediate portion 26c. As seen from FIG. 3, the heat conduction sheet 26 is bonded to the flange portion 25 of the vessel 19 with an adhesive agent 27, and closes the open end of the recess 24. The sheet 26 is exposed to the outside of the heat pipe 16.

Figure 4:
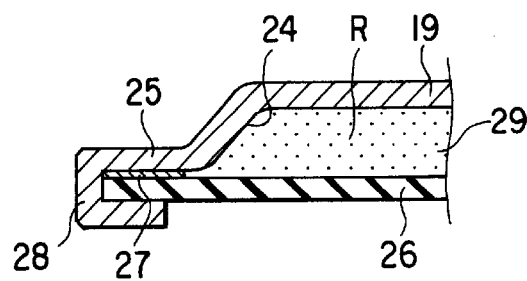
FIG. 4 is a sectional view of the heat pipe showing another joint structure for the vessel and the heat conduction sheet.

FIG. 4 shows a configuration for enhancing the strength of the bond between the heat conduction sheet 26 and the flange portion 25. In this example, a curling portion 28 is formed on the distal end edge portion of the flange portion 25. The curling portion 28 is folded back to wrap the outer peripheral edge portion of the heat conduction sheet 26 therein. The outer peripheral portion of the heat conduction sheet 26 is held between the curling portion 28 and the flange portion 25.

The heat conduction sheet 26, in conjunction with the recess 24 of the vessel 19, defines a refrigerant passage 29. The passage 29 extends covering the heat receiving portion 20, heat dissipating portion 21, and heat transfer portion 22. A liquid refrigerant R, such as water or alcohol, is sealed in the passage 29. Thus, the heat conduction sheet 26 is exposed to the refrigerant passage 29 and directly in contact with the refrigerant R.

As shown in FIGS. 2 and 5, the heat receiving portion 20 of the heat pipe 16 is pressed against the semiconductor package 7 by means of a first metal bracket 30. The first metal bracket 30 includes a holding portion 31 and a pair of flange portions 32a and 32b that are continuous with the holding portion 31. The holding portion 31 straddles the heat receiving portion 20 and the semiconductor package 7 on and over the circuit board 6. The flange portions 32a and 32b are fixed to the mounting surface 6a of the board 6 by means of screws 33.

The heat receiving portion 20 of the heat pipe 16 is sandwiched between the holding portion 31 of the first metal bracket 30 and the cover plate 10 of the semiconductor package 7. Thus, the first end portion 26a of the heat conduction sheet 26 that corresponds to the heat receiving portion 20 is pressed directly against the cover plate 10 and connected thermally to the plate 10.

As shown in FIG. 1, the heat transfer portion 22 of the heat pipe 16 projects backward from the rear end of the circuit board 6. The heat dissipating portion 21 of the pipe 16 is situated in the rear end portion of the housing 4, and is kept at a distance equivalent to the length of the heat transfer portion 22 from the heat receiving portion 20.

The heat sink 17 is formed of a metallic material having high heat conductivity, such as aluminum alloy. The heat sink 17 is attached to the h eat dissipating portion 21 of the heat pipe 16 by means of a second metal bracket 35. The second metal bracket 35 includes a holding portion 36 and a pair of flange portions 37a and 37b that are continuous with the holding portion 36. The holding portion 36 straddles the heat dissipating portion 21 on and over the heat sink 17. The flange portions 37a and 37b are fixed to the heat sink 17 by means of screws 38.

The heat dissipating portion 21 of the heat pipe 16 is sandwiched between the holding portion 36 of the second metal bracket 35 and the heat sink 17. Thus, the second end portion 26b of the heat conduction sheet 26 that corresponds to the heat dissipating portion 21 is pressed directly against the heat sink 17 and connected thermally to the sink 17.

If the semiconductor package 7 is made to execute complicated arithmetic processing, in the portable computer 1 constructed in this manner, the heat release value of the IC chip 9 increases. The heat from the IC chip 9 is transmitted through the cover plate 10 to the heat receiving portion 20 of the heat pipe 16. By this heat transfer, the refrigerant R in the heat receiving portion 20 is heated and reduced to vapor, which flows from the heat receiving portion 20 into the heat dissipating portion 21 through the heat transfer portion 22. Since the heat dissipating portion 21 is situated at a distance from the semiconductor package 7, its temperature and internal pressure are kept lower than those of the heat receiving portion 20.

Thus, the vapor guided to the heat dissipating portion 21 radiates heat and condenses therein. The heat radiated by this condensation of the refrigerant R is diffused by the heat conduction from the heat dissipating portion 21 to the heat sink 17, and is discharged from the surface of the heat sink 17 into the housing 4 by natural air-cooling.

The refrigerant R that is liquefied by heat exchange in the heat dissipating portion 21 is caused to flow along the inner surface of the heat transfer portion 22 by capillarity, and returns to the heat receiving portion 20. The refrigerant R is heated and reduced again to vapor by heat from the semiconductor package 7. As the evaporation and condensation of the refrigerant R are repeated, heat from the heat receiving portion 20 is transferred to the heat dissipating portion 21.

According to the arrangement described above, that part of the heat receiving portion 20 of the heat pipe 16 which faces the cover plate 10 of the semiconductor package 7 is composed of the heat conduction sheet 26. The sheet 26 is soft and elastic. If its first end portion 26a is brought into contact with the cover plate 10 of the package 7, therefore, it is deformed and adheres to the plate 10 so as to compensate for lowering of the heat conductivity that is attributable to the surface roughness of the plate 10 or absorb a gap that hinders heat conduction.

When the heat pipe 16 is connected thermally to the semiconductor package 7, therefore, only the heat conduction sheet 26 is interposed between the cover plate 10 and the refrigerant R, so that heat transmitted from the plate 10 to the sheet 26 can be transmitted directly to the refrigerant R.

Thus, the thermal resistance of a heat conduction path that extends from the cover plate 10 to the refrigerant R can be lowered, and the efficiency of heat conduction from the plate 10 to the refrigerant R can be improved considerably.

Further, the first end portion 26a of the heat conduction sheet 26 is pressed against the cover plate 10 of the semiconductor package 7 by means of the first metal bracket 30, and its substantially whole surface is in contact with the plate 10. If the refrigerant R is expanded by heat exchange in the heat receiving portion 20, therefore, the first end portion 26a of the soft heat conduction sheet 26 can never be inflated like a balloon, and the sheet 26 can be prevented from being damaged.

If the temperature of the heat receiving portion 20 is increased by the heat conduction from the cover plate 10, the internal pressure of the portion 20 increases as the refrigerant R expands. Accordingly, pressure acts on the first end portion 26a of the heat conduction sheet 26 to press it against the cover plate 10, so that the adhesion between the plate 10 and the sheet 26 is enhanced. Therefore, the efficiency of heat conduction from the cover plate 10 to the heat conduction sheet 26 is improved further.

Besides, that part of the heat dissipating portion 21 of the heat pipe 16 which faces the heat sink 17 is also composed of the heat conduction sheet 26, and the second end portion 26b is directly in contact with the heat sink 17. Thus, the sheet 26 is deformed and adheres to the sink 17 so as to compensate for lowering of the heat conductivity that is attributable to the surface roughness of the sink 17 or absorb a gap that hinders heat conduction.

Accordingly, the thermal resistance of a heat conduction path that extends from the heat dissipating portion 21 to the heat sink 17 can be lowered, and the efficiency of heat conduction from the portion 21 to the sink 17 can be improved considerably.

According to the heat pipe 16 constructed in this manner, moreover, the soft heat conduction sheet 26 defines the refrigerant passage 29 in conjunction with the recess 24 of the vessel 19, and faces the passage 29. Accordingly, the vessel 19 and the sheet 26 never overlap each other at the thermal junctions between the heat receiving portion 20 and the semiconductor package 7 and between the heat dissipating portion 21 and the heat sink 17. Thus, the thickness of each thermal junction can be reduced.

In consequence, the cooling unit 15 can be incorporated conveniently in the housing 4 that is limited in size, and can be applied naturally to modern thinned housings.

Figure 7:
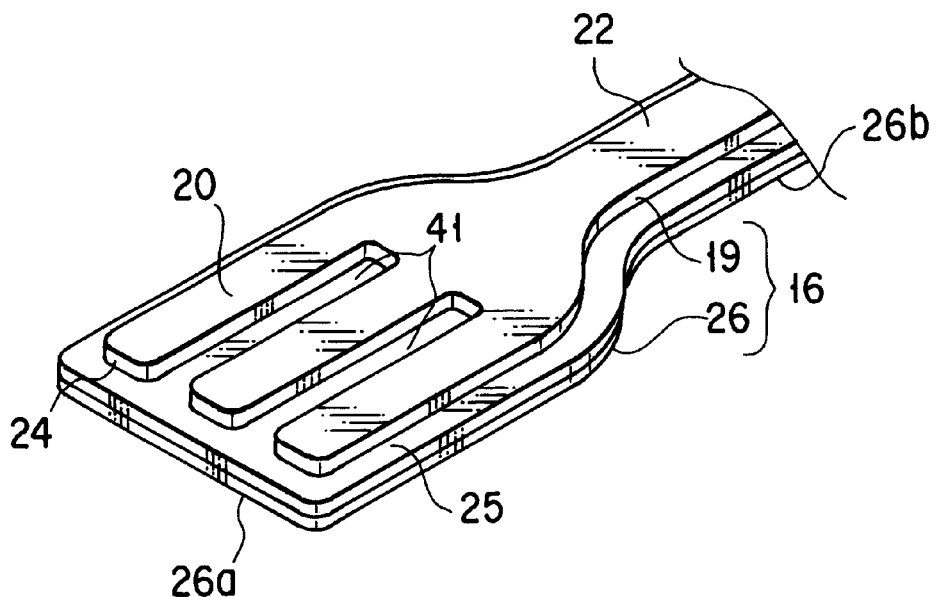
FIG. 7 is a perspective view of a heat pipe according to a second embodiment of the invention.
Figure 8:
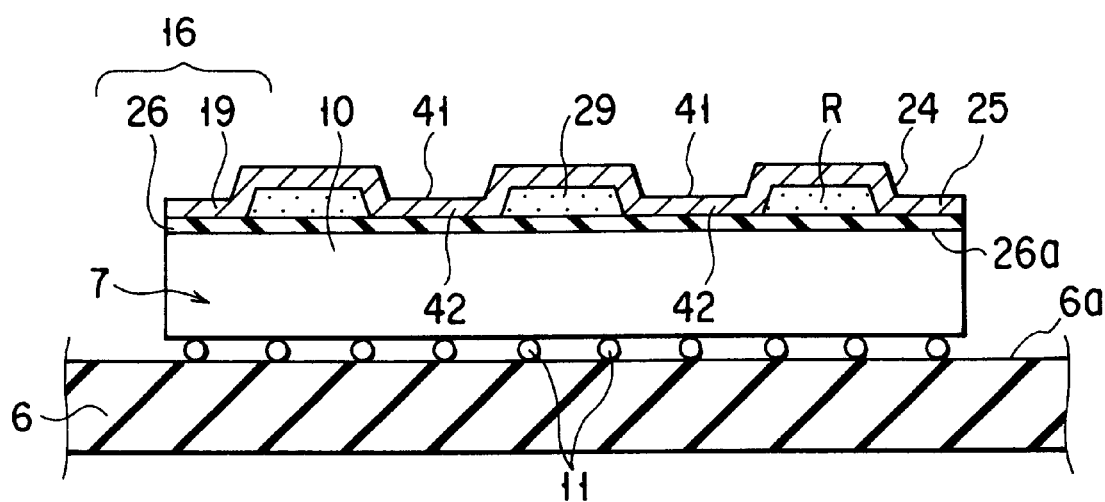
FIG. 8 is a sectional view showing a thermal junction between a semiconductor package and a heat pipe according to the second embodiment.

The present invention is not limited to the first embodiment described above. FIGS. 7 and 8 show a second embodiment. The second embodiment differs from the first embodiment in the configuration of the heat receiving portion 20 of the heat pipe 16. The first and second embodiments share other basic configurations of the heat pipe 16.

As shown in FIGS. 7 and 8, the heat receiving portion 20 of the vessel 19 has a plurality of projections 41 in the bottom of its recess 24. The projections 41 project toward the first end portion 26a of the heat conduction sheet 26. Each projection 41 is in the form of a rib that extends in a straight line in the longitudinal direction of the heat pipe 16. The projections 41 extend parallel to one another with spaces in the width direction of the heat receiving portion 20 between them.

The distal end of each projection 41 forms a flat support portion 42. The support portion 42 is situated at the open end of the recess 24 and flush with the flange portion 25. Thus, the support portion 42 is in contact with the central part of the first end portion 26a of the heat conduction sheet 26, and supports the first end portion 26a from inside the refrigerant passage 29.

According to this arrangement, the outer peripheral part of the first end portion 26a of the heat conduction sheet 26 is supported by means of the flange portion 25 of the vessel 19, and its central part surrounded by the outer peripheral part is supported by means of the support portions 42. If the area of the first end portion 26a is increased to match the large-sized semiconductor package 7, therefore, there is no possibility of the central part of the first end portion 26a being depressed and getting into the refrigerant passage 29.

More specifically, the cover plate 10 of the semiconductor package 7 increases in size as the package 7 becomes larger. In order to realize higher-efficiency heat conduction, therefore, it is necessary to widen the area of the first end portion 26a that is in contact with the plate 10. If only the outer peripheral part of the first end portion 26a of the soft heat conduction sheet 26 is fixed to the vessel 19, in this case, the central part of the first end portion 26a becomes easily bendable and unstable. Possibly, therefore, the central part of the first end portion 26a of the heat conduction sheet 26 may be depressed when the first end portion 26a is pressed against the cover plate 10. In consequence, a gap is created between the first end portion 26a and the cover plate 10, so that the adhesion between the sheet 26 and the plate 10 is lowered inevitably.

If the central part of the first end portion 26a is supported by means of the support portions 42 from inside the refrigerant passage 29, however, it can be held between the support portions 42 and the cover plate 10 when the first end portion 26a is pressed against the plate 10. Thus, satisfactory adhesion can be secured between the central part of the first end portion 26a and the cover plate 10, so that the efficiency of heat conduction from the plate 10 to the refrigerant R can be improved.

In this second embodiment, the projections 41 may be formed on the heat dissipating portion 21 of the vessel 19 as well as on the heat receiving portion 20. By doing this, the adhesion between the central part of the second end portion 26b of the heat conduction sheet 26 and the heat sink 17 can be enhanced.

Figure 9:
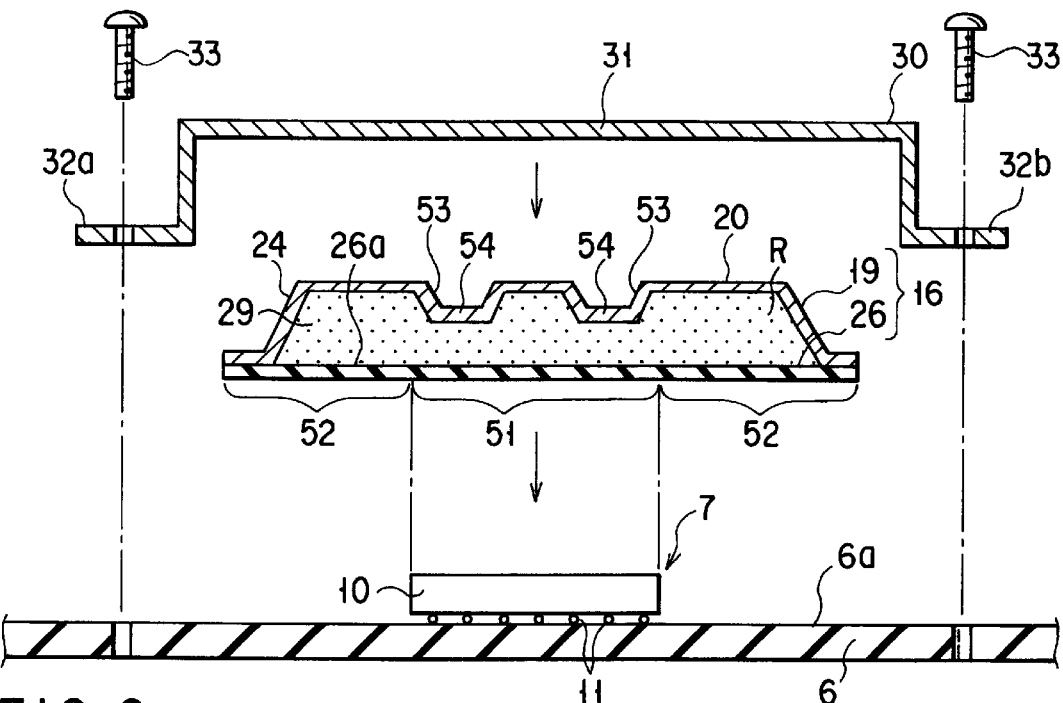
FIG. 9 is a sectional view showing a semiconductor package and a heat pipe according to a third embodiment in a separate state.
Figure 10:
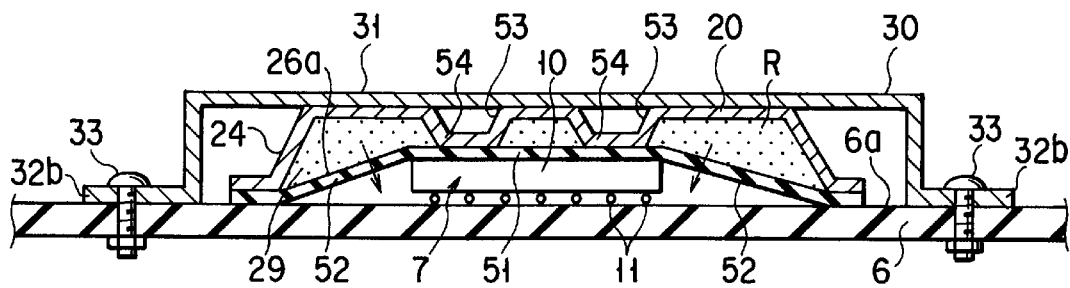
FIG. 10 is a sectional view showing a heat receiving portion of the heat pipe according to the third embodiment fixed to the semiconductor package.
Figure 11:
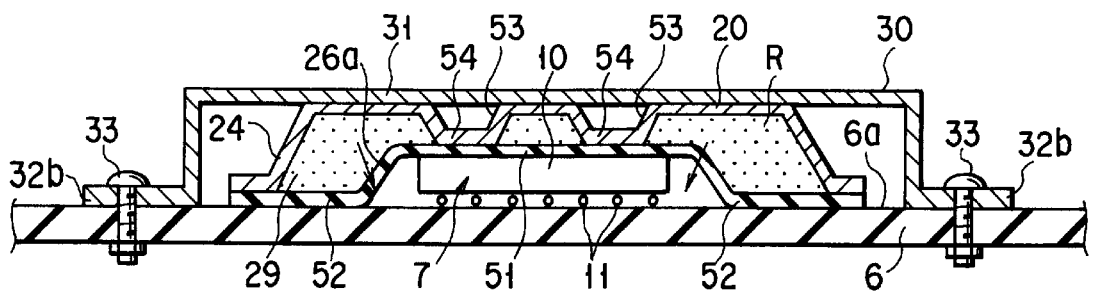
FIG. 11 is a sectional view showing a heat conduction sheet according to the third embodiment in contact with both the semiconductor package and a circuit board.

FIGS. 9 to 11 show a third embodiment of the invention.

According to this third embodiment, the circuit board 6 that receives the heat from the semiconductor package 7 is simultaneously cooled by means of the heat pipe 16. This heat pipe 16 is constructed basically in the same manner as the one according to the first embodiment. In the description of the third embodiment to follow, therefore, like reference numerals refer to like components used in the first embodiment, and a description of those components is omitted.

As shown in FIG. 9, the heat receiving portion 20 of the heat pipe 16 has a size much greater than that of the semiconductor package 7. More specifically, the first end portion 26a of the heat conduction sheet 26 that corresponds to the heat receiving portion 20 includes a central portion 51 that faces the cover plate 10 and an outer peripheral portion 52 that projects around the package 7 from the central portion 51.

Further, the recess 24 of the vessel 19 has a plurality of projections 53 that protrude from its bottom in the refrigerant passage 29. The distal end of each projection 53 forms a flat support portion 54. The support portion 54 faces the central portion 51 of the heat conduction sheet 26.

The following is a description of steps of procedure for thermally connecting the heat receiving portion 20 of the heat pipe 16 to the semiconductor package 7 and the circuit board 6 in this arrangement. First, the central portion 51 of the heat conduction sheet 26 is put on the cover plate 10 of the package 7. Then, the heat receiving portion 20 is fixed to the circuit board 6 by means of the first metal bracket 30.

Thereupon, the heat receiving portion 20 is sandwiched between the holding portion 31 of the first metal bracket 30 and the cover plate 10, and the first end portion 26a of the heat conduction sheet 26 is elastically deformed upward, depending on the thickness of the semiconductor package 7, as shown in FIG. 10. Thus, the respective support portions 54 of the projections 53 at the bottom of the recess 24 touch the central portion 51 of the sheet 26, whereupon the central portion 51 is held between the cover plate 10 and the support portions 54. In consequence, the central portion 51 of the heat conduction sheet 26 adheres to the plate 10 and is connected thermally to the plate 10.

Further, the distal end edge portion of the outer peripheral portion 52 of the heat conduction sheet 26 is pressed against the mounting surface 6a of the circuit board 6. At the same time, the whole area of the outer peripheral portion 52 except its distal end edge portion faces the mounting surface 6a of the board 6. Thus, the first end portion 26a of the sheet 26 is fixed on the circuit board 6 in a manner such that it straddles the semiconductor package 7 and the mounting surface 6a of the board 6.

When the IC chip 9 of the semiconductor package 7 generates heat, therefore, the heat from the chip 9 is transmitted to the first end portion 26a of the heat conduction sheet 26 through the cover plate 10. Thus, the refrigerant R in the heat receiving portion 20 is heated and expanded. Thereupon, the outer peripheral portion 52 of the soft heat conduction sheet 26 is subjected to pressure such that it is pressed toward the circuit board 6, as indicated by the arrows in FIG. 10. In consequence, the outer peripheral portion 52 of the sheet 26 is deformed and adheres to the mounting surface 6a of the board 6 so as to fill the gap between the circuit board 6 and the heat receiving portion 20, as seen from FIG. 11.

Thus, the heat conduction sheet 26 is connected thermally to that part of the circuit board 6 which surrounds the semiconductor package 7, and heat from the board 6 is transmitted to the refrigerant R through the heat conduction sheet 26.

According to this arrangement, the heat transmitted from the semiconductor package 7 to the circuit board 6 can be absorbed by means of the heat receiving portion 20 of the heat pipe 16. Thus, the heat from the package 7 can be efficiently transmitted to the refrigerant R, whereby the cooling performance of the package 7 can be improved, and temperature increase of the circuit board 6 can be restrained.

In the circuit board 6, moreover, many of the wiring patterns that are connected electrically to the semiconductor package 7 are concentrated on that region of the mounting surface 6a that surrounds the package 7. Therefore, the surrounding region is a relatively flat surface that carries no chip components or the like, and the outer peripheral portion 52 of the heat conduction sheet 26 touches this region. Thus, the adhesion between the sheet 26 and the circuit board 6 is satisfactory, and the heat from the board 6 can be efficiently transferred to the sheet 26.

Figure 12:
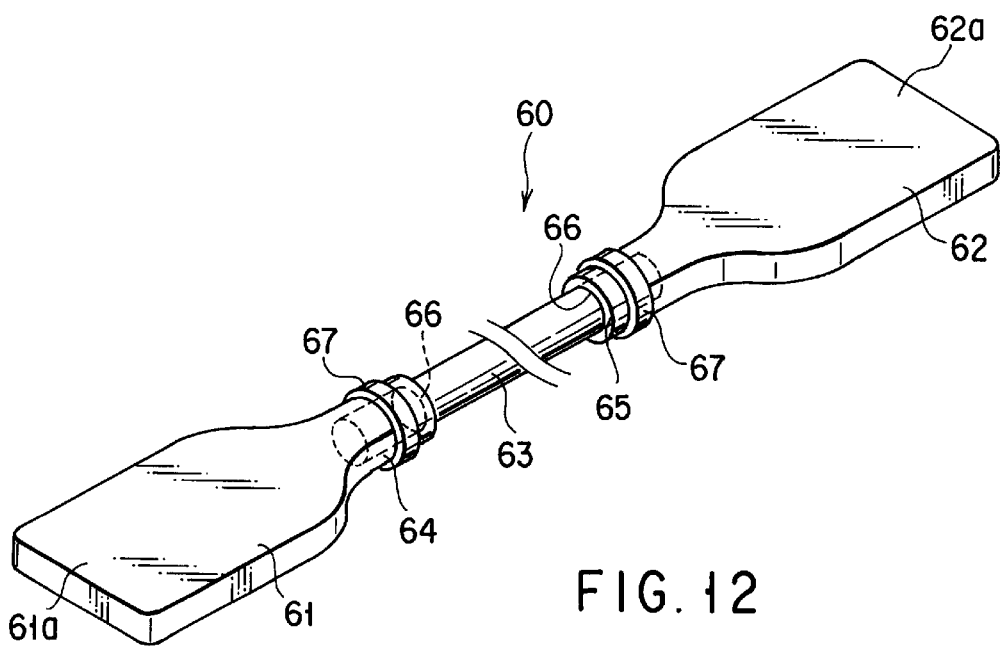
FIG. 12 is a perspective view of a heat pipe according to a fourth embodiment of the invention.
Figure 13:
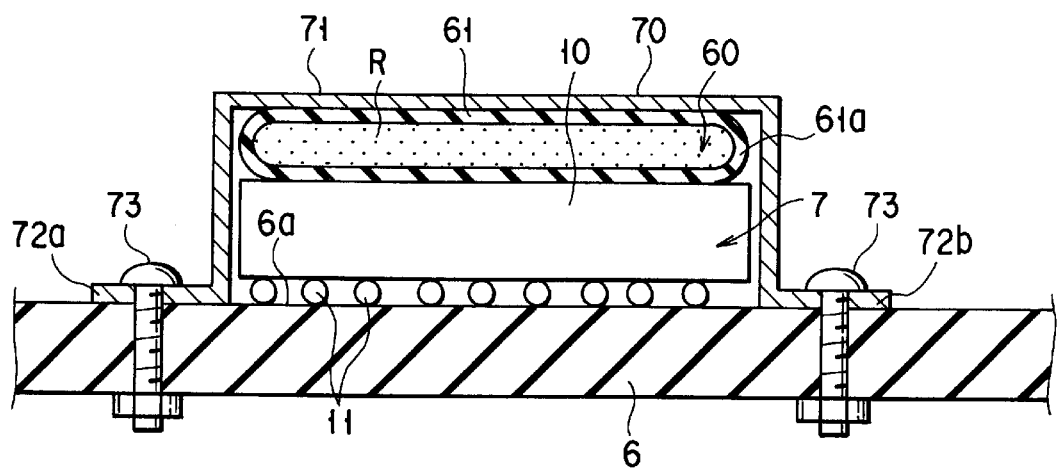
FIG. 13 is a sectional view showing a heat receiving portion of the heat pipe according to the fourth embodiment fixed to a semiconductor package.

FIGS. 12 and 13 show a fourth embodiment of the invention.

A heat pipe 60 according to the fourth embodiment comprises a heat receiving portion 61, a heat dissipating portion 62, and a pipeline 63 for transferring heat.

The heat receiving portion 61 and the heat dissipating portion 62 include pouches 61a and 62a, respectively. Each of the pouches 61a and 62a is formed of a soft rubberlike elastic body that is loaded with a filler having high heat conductivity, for example. The thickness of each pouch is adjusted to about 0.1 to 1 mm. The pouches 61a and 62a have cylindrical neck portions 64 and 65, respectively. Each neck portion has a socket 66 that opens in one end thereof. The sockets 66 are continuous with the interior of the pouches 61a and 62a.

The pipeline 63 is formed of a round metallic pipe. One end of the pipeline 63 is fitted in the socket 66 of the pouch 61a. The other end of the pipeline 63 is fitted in the socket 66 of the pouch 62a. The one and the other ends of the pipeline 63 are fixed to the neck portions 64 and 65, respectively, by means of belts 67, individually. The pouches 61a and 62a and the pipeline 63 are filled with the refrigerant R.

As shown in FIG. 13, the heat receiving portion 61 of the heat pipe 60 is pressed against the semi-conductor package 7 by means of a metal bracket 70. The bracket 70 includes a holding portion 71, which straddles the heat receiving portion 61 and the package 7, and a pair of flange portions 72a and 72b continuous with the holding portion 71. The flange portions 72a and 72b are fixed to the mounting surface 6a of the circuit board 6 by means of screws 73, individually.

The heat receiving portion 61 of the heat pipe 60 is sandwiched between the holding portion 71 of the metal bracket 70 and the cover plate 10 of the semiconductor package 7. Therefore, the soft pouch 61a of the heat receiving portion 61 is flattened, so that the heat receiving portion 61 is brought into intimate contact with the cover plate 10.

The heat dissipating portion 62 of the heat pipe 60 are brought into intimate contact with the heat sink by means of a similar metal bracket (not shown).

According to this arrangement, the heat receiving portion 61 of the heat pipe 60 is composed of the soft pouch 61a. Therefore, the heat receiving portion 61 is kept in a state such that it can be freely deformed following the shape of the semiconductor package 7, and can satisfactorily adhere to the package 7. The heat dissipating portion 62 is also composed of the soft pouch 62a. Therefore, the heat dissipating portion 62 is kept in a state such that it can be freely deformed following the shape of the heat sink, and can satisfactorily adhere to the heat sink.

Thus, the heat pipe 60 never fails to be connected thermally to the semiconductor package 7 and the heat sink, and the heat dissipation performance of the package 7 can be enhanced.

Further, the thermal resistance of a heat conduction path that extends from the semiconductor package 7 to the refrigerant R can be lowered, and the efficiency of heat conduction from the package 7 to the refrigerant R can be improved considerably.

Figure 14:
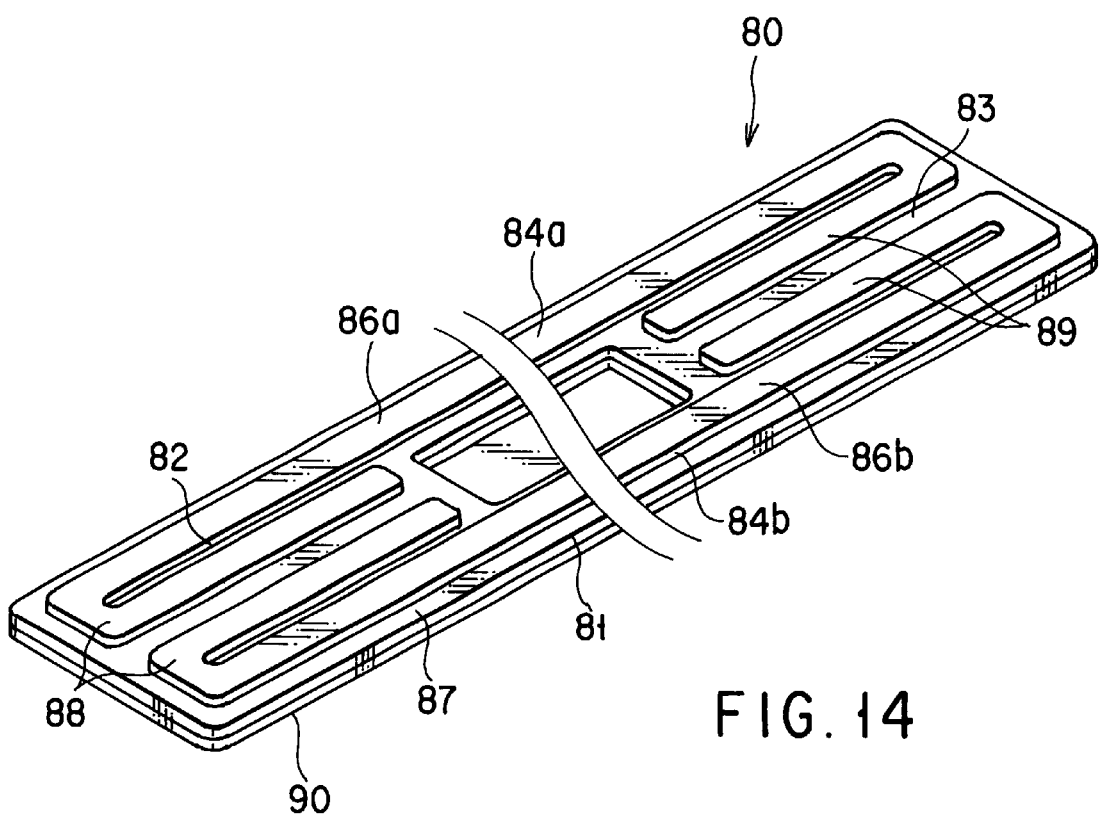
FIG. 14 is a perspective view of a heat pipe according to a fifth embodiment of the invention.
Figure 15:
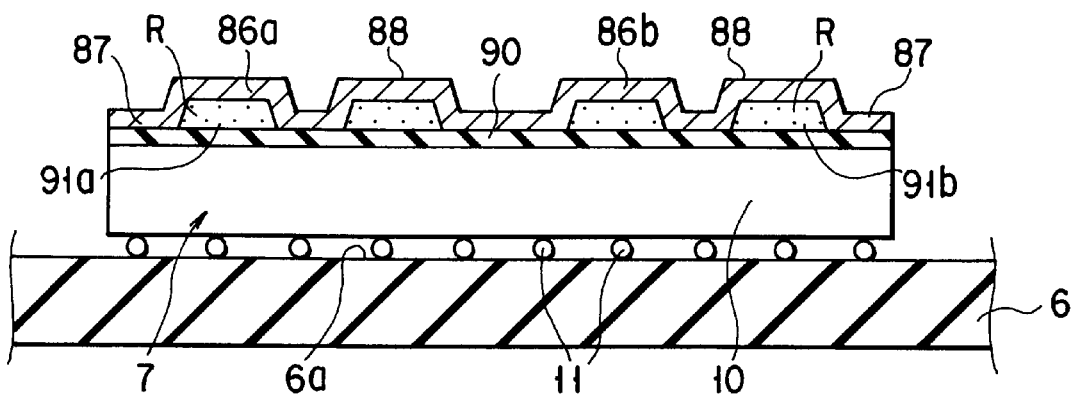
FIG. 15 is a sectional view showing a heat receiving portion of the heat pipe according to the fifth embodiment fixed to a semiconductor package.

FIGS. 14 and 15 show a fifth embodiment of the invention.

A heat pipe 80 according to the fifth embodiment comprises an elongate metallic vessel 81 and a heat conduction sheet 90. The vessel 81 includes a heat receiving portion 82, a heat dissipating portion 83, and first and second heat transfer portions 84a and 84b.

The heat receiving portion 82 and the heat dissipating portion 83 are spaced in the longitudinal direction of the vessel 81 and are wider than the first and second heat transfer portions 84a and 84b. The heat transfer portions 84a and 84b connect the heat receiving and dissipating portions 82 and 83 in straight lines and are arranged parallel to each other.

The vessel 81 has first and second recesses 86a and 86b. The first and second recesses 86a and 86b are formed by drawing the vessel 81. The recesses 86a and 86b extend along the first and second heat transfer portions 84a and 84b, respectively, and open downward on the bottom side of the vessel 81. A flat flange portion 87 is formed on the outer peripheral edge portion of the recesses 86a and 86b.

One end of each of the first and second recesses 86a and 86b is guided to the heat receiving portion 82. A doubled or bent portion 88 is formed on one end of each of the recesses 86a and 86b. The respective bent portions 88 of the first and second recesses 86a and 86b adjoin each other on the heat receiving portion 82.

The other end of each of the first and second recesses 86a and 86b is guided to the heat dissipating portion 83. A doubled or bent portion 89 is formed on the other end of each of the recesses 86a and 86b. The respective bent portions 89 of the first and second recesses 86a and 86b adjoin each other on the heat dissipating portion 83.

The heat conduction sheet 90, like the one in the first embodiment, is formed of a soft rubberlike elastic body. The sheet 90 is fixed to the flange portion 87 of the vessel 81 and closes the respective open ends of the first and second recesses 86a and 86b. The sheet 90, in conjunction with the recesses 86a and 86b, constitute first and second refrigerant passages 91a and 91b. The refrigerant R is sealed in the passages 91a and 91b.

According to this arrangement, that part of the heat receiving portion 82 of the heat pipe 80 which receives the heat from the semiconductor package 7 is composed of the soft heat conduction sheet 90. The sheet 90 can be deformed and adheres to the package 7 so as to compensate for lowering of the heat conductivity that is attributable to the surface roughness of the package 7 or absorb a gap that hinders heat conduction.

In consequence, the heat transmitted from the semiconductor package 7 to the heat conduction sheet 90 can be transmitted directly to the refrigerant R, and the heat from the package 7 transmitted to the heat receiving portion 82 can be efficiently transferred to the heat dissipating portion 83 by utilizing the refrigerant R that flows through the two refrigerant passages 91a and 91b.

In this fifth embodiment, the respective bent portions 89 of the first and second recesses 86a and 86b may be meandered. According to this arrangement, the heat receiving portion 82 and the heat dissipating portion 83 can be formed having a long winding passage, and the refrigerant R can pass through the passage for a long time. Therefore, plenty of heat can be transmitted to the refrigerant R in the heat receiving portion 82, and plenty of heat can be removed from the refrigerant R in the heat dissipating portion 83. Thus, the efficiency of heat conduction of the heat pipe 80 can be improved considerably, and the heat dissipation performance of the semiconductor package 7 can be enhanced.

Figure 16:
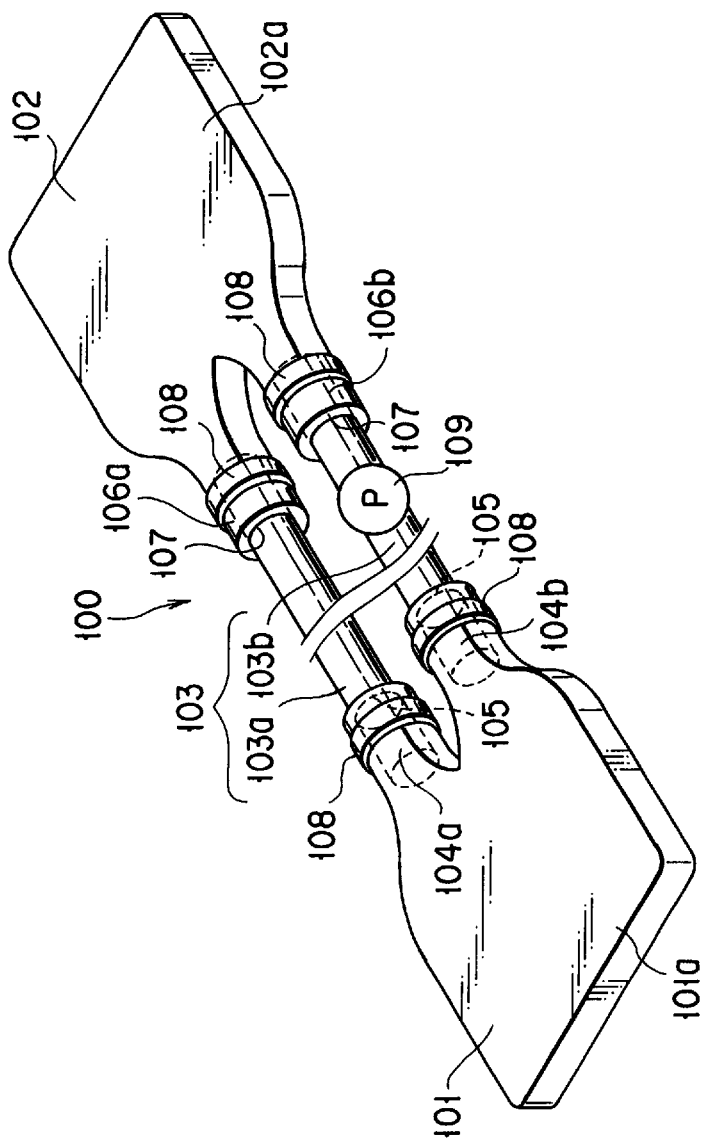
FIG. 16 is a perspective view of a cooling unit according to a sixth embodiment of the invention.
Figure 17:
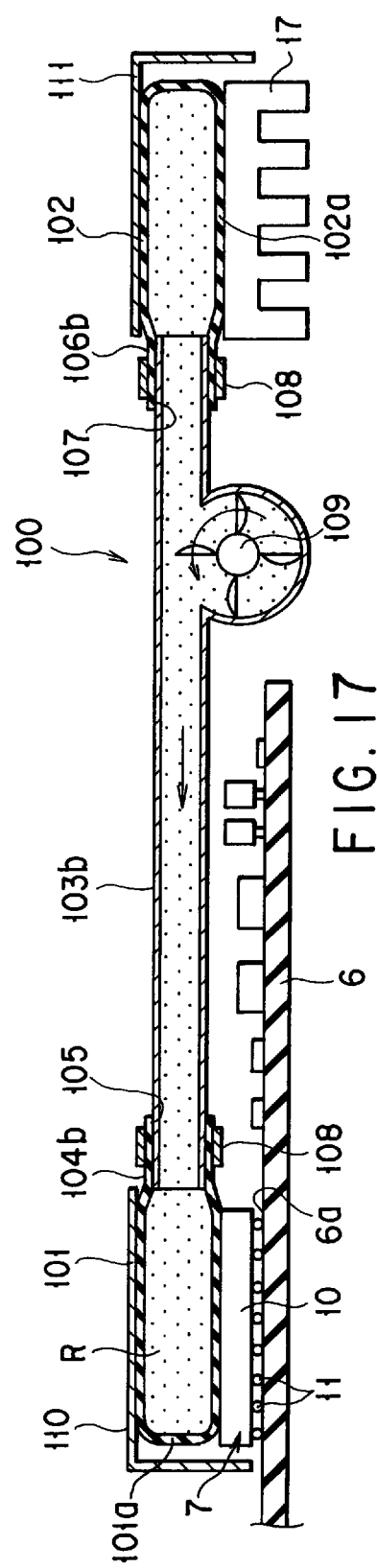
FIG. 17 is a sectional view showing a cooling unit including a heat sink connected thermally to a semiconductor package according to the sixth embodiment.

FIGS. 16 and 17 show a sixth embodiment of the invention.

Disclosed according to the sixth embodiment is a cooling unit 100 in which the refrigerant R is circulated automatically. The cooling unit 100 is composed of a heat receiving portion 101, a heat dissipating portion 102, and a heat transfer portion 103.

The heat receiving portion 101 and the heat dissipating portion 102 include soft pouches 101a and 102a, respectively. Each of the pouches 101a and 102a is formed of a soft rubberlike elastic body that is loaded with a filler having high heat conductivity, for example. The thickness of each pouch is adjusted to about 0.1 to 1 mm. The pouch 101a has a pair of cylindrical neck portions 104a and 104b at one end thereof. The neck portions 104a and 104b are arranged parallel to each other and have their respective sockets 105. The sockets 105 are continuous with the interior of the pouch 101a.

The pouch 102a has a pair of cylindrical neck portions 106a and 106 at one end thereof. The neck portions 106a and 106b are arranged parallel to each other and have their respective sockets 107. The sockets 107 are continuous with the interior of the pouch 102a.

The heat transfer portion 103 is provided with first and second pipelines 103a and 103b. The pipelines 103a and 103b, which are formed of a round metallic pipe each, connect the heat receiving portion 101 and the heat dissipating portion 102. One end of each of the pipelines 103a and 103b is connected to its correction socket 105 of the pouch 101a. The other end of each of the pipelines 103a and 103b is connected to its correction socket 107 of the pouch 102a.

The first and second pipelines 103a and 103b are fixed to the neck portions 104a, 104b, 106a and 106b by means of belts 108, individually. The pouches 101a and 102a and the first and second pipelines 103a and 103b are filled with the refrigerant R.

The first pipeline 103a serves to guide the refrigerant R, heated by heat exchange in the heat receiving portion 101, to the heat dissipating portion 102. The second pipeline 103b serves to guide the refrigerant R, cooled by heat exchange in the heat dissipating portion 102, to the heat receiving portion 101.

The second pipeline 103b is provided with a motor pump 109. The pump 109 automatically delivers the refrigerant R toward the heat receiving portion 101. The refrigerant R fed into the heat receiving portion 101 is guided therefrom to the heat dissipating portion 102 through the first pipeline 103a and returned to the pump 109 through the second pipeline 103b. Thus, the refrigerant R is automatically circulated between the heat receiving and dissipating portions 101 and 102.

As shown in FIG. 17, the heat receiving portion 101 is pressed against the cover plate 10 of the semiconductor package 7 by means of a first metal bracket 110. The heat receiving portion 101 is sandwiched between the bracket 110 and the package 7. Thus, the pouch 101a adheres to the cover plate 10 in a manner such that it is flattened.

The heat dissipating portion 102 is pressed against the heat sink 17 by means of a second metal bracket 111. The heat dissipating portion 102 is sandwiched between the bracket 111 and the sink 17. Thus, the pouch 102a adheres to the heat sink 17 in a manner such that it is flattened.

According to this arrangement, the refrigerant R is automatically circulated between the heat receiving and dissipating portions 101 and 102. Therefore, the heat from the semiconductor package 7 transmitted to the heat receiving portion 101 can be transferred to the heat dissipating portion 102 via the refrigerant R and discharged into the air by diffusion based on heat conduction to the heat sink 17.

The heat receiving portion 101 of the cooling unit 100 is formed of the soft pouch 101a having heat conductivity. Therefore, the heat receiving portion 101 can be freely deformed following the shape of the semiconductor package 7, and can satisfactorily adhere to the package 7. Further, the heat dissipating portion 102 is formed of the soft pouch 102a having heat conductivity. Therefore, the heat dissipating portion 102 can be freely deformed following the shape of the heat sink 17, and can satisfactorily adhere to the heat sink 17.

Accordingly, the efficiency of heat conduction from the semiconductor package 7 to the heat receiving portion 101 and from the heat dissipating portion 102 to the heat sink 17 is improved, and the cooling performance of the package 7 is enhanced considerably.

Although the refrigerant R is circulated automatically according to the sixth embodiment, it may alternatively be circulated by natural convection. In this case, it is to be desired that the heat receiving portion 101 should be located in a lower position than the heat dissipating portion 102, and that the second pipeline 103b for returning the refrigerant R liquefied in the heat dissipating portion 102 should be inclined downward in the flowing direction of the refrigerant R.

Alternatively, moreover, the first pipeline 103a for guiding the refrigerant R, heated and reduced to vapor, to the heat dissipating portion 102 may be formed having a diameter larger than that of the second pipeline 103b. By doing this, the flow resistance of the vapor that moves from the heat receiving portion 101 to the heat dissipating portion 102 can be lowered.

Further, a temperature sensor for detecting the temperature of the IC chip 9 may be set close to the semiconductor package 7 so that the operation of the pump 109 can be controlled in accordance with a signal from the temperature sensor. More specifically, the pump 109 may be driven in accordance with a temperature signal from a temperature sensor when a predetermined value is exceeded by the temperature of the chip 9. If this is done, the pump 109 need not be operated continually, so that power can be saved, and the noise level of the operation of the pump 109 can be lowered.

Figure 18:
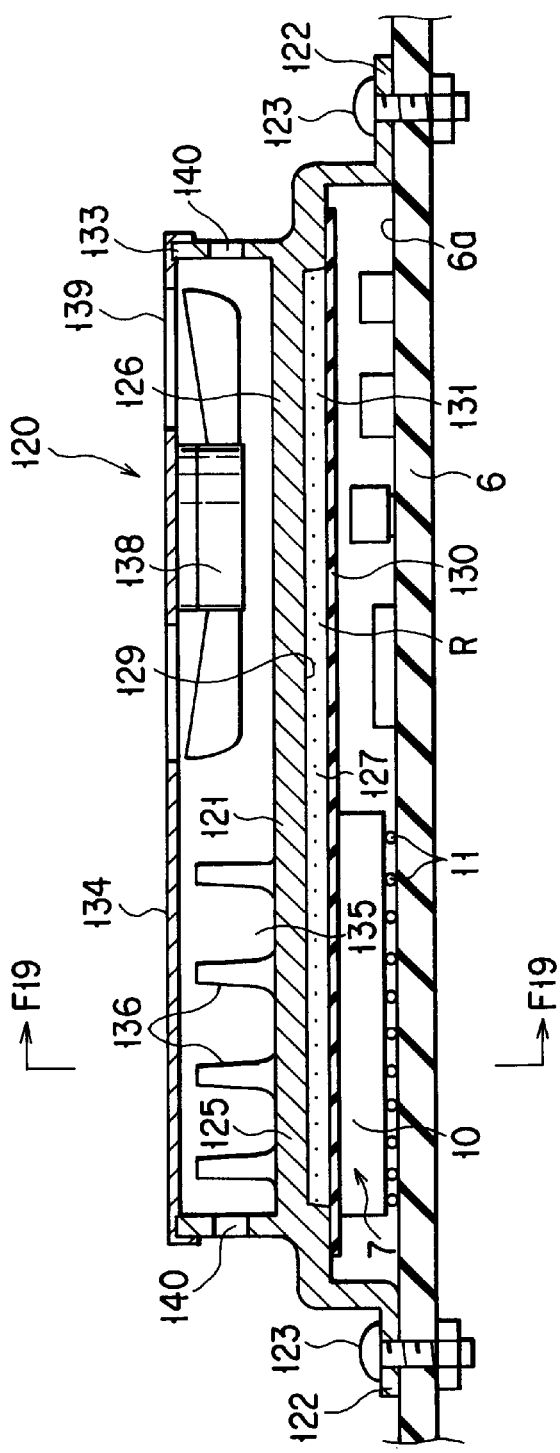
FIG. 18 is a sectional view of a cooling unit according to a seventh embodiment of the invention.
Figure 19:
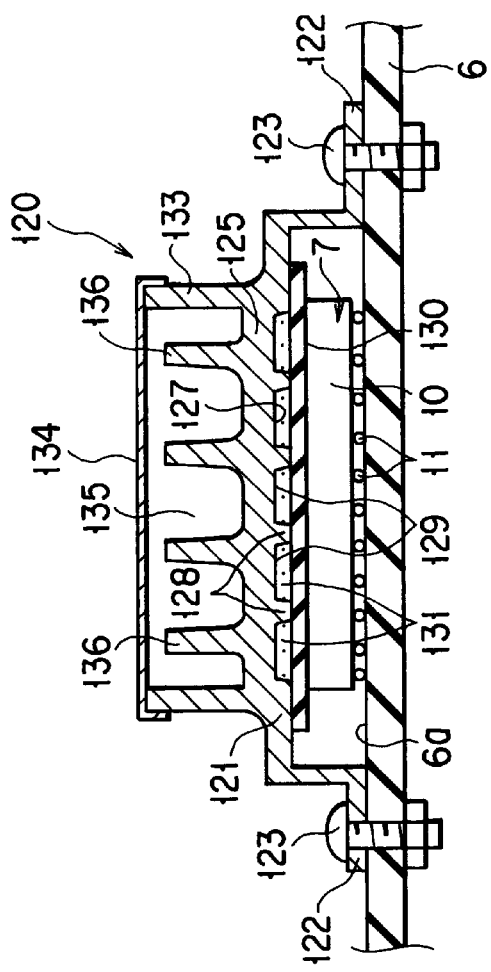
FIG. 19 is a sectional view taken along line F19—F19 of FIG. 18.

FIGS. 18 and 19 show a seventh embodiment of the invention.

A cooling unit 120 according to the seventh embodiment has a platelike main body 121. The main body 121 is formed of a metallic material having high heat conductivity, such as aluminum alloy. The main body 121 includes a plurality of leg portions 122 that extend downward from its outer peripheral edge portion. The respective distal ends of the leg portions 122 are fixed to the mounting surface 6a of the circuit board 6 by means of screws 123, respectively. Thus, the main body 121 is located parallel to the circuit board 6, and the semiconductor package 7 is interposed between the main body 121 and the board 6.

The main body 121 integrally includes a heat receiving portion 125 that receives heat from the semiconductor package 7 and a heat dissipating portion 126 that dissipates the heat from the package 7. The heat receiving portion 125 is situated right over the package 7. The heat dissipating portion 126 is situated off the package 7. The heat dissipating portion 126 is connected thermally to the heat receiving portion 125.

The main body 121 has a recess 127 that opens downward in its lower surface. The recess 127 extends ranging from the heat receiving portion 125 to the heat dissipating portion 126. The recess 127 is divided into a plurality of channel portions 129 by means of partition walls 128. The extreme end of each wall 128 is flush with the lower surface of the main body 121. The channel portions 129 extend straight between the heat receiving and dissipating portions 125 and 126.

A heat conduction sheet 130 is stuck to the lower surface of the main body 121. The sheet 130 is formed of a soft rubberlike elastic body that is loaded with a filler having high heat conductivity, for example, and its thickness is adjusted to about 0.1 to 1 mm. The sheet 130 covers the open end of the recess 127 and touches the respective distal ends of the partition walls 128. The heat conduction sheet 130 touches the cover plate 10 of the semiconductor package 7 in a position corresponding to the heat receiving portion 125, and is connected thermally to the plate 10.

Refrigerant passages 131 are defined between the heat conduction sheet 130 and the channel portions 129. One end of each refrigerant passage 131 is situated in the heat receiving portion 125, and the other end is situated in the heat dissipating portion 126. The refrigerant R is sealed in the refrigerant passages 131.

As shown in FIGS. 18 and 19, the main body 121 includes an upright wall 133 that extends upward from its outer peripheral edge portion. The wall 133 is formed continuously in the circumferential direction of the main body 121. A top plate 134 is fixed to the upper end of the wall 133. The top plate 134, in conjunction with the upper surface of the main body 121 and the upright wall 133, defines a cooling air passage 135. The passage 135 extends ranging from the heat receiving portion 125 to the heat dissipating portion 126, and is connected thermally to the refrigerant passages 131 via the main body 121.

The main body 121 has pin-shaped radiating fins 136 in a position corresponding to the heat receiving portion 125. The fins 136 are exposed to the cooling air passage 135. A motor fan 138 is supported on the lower surface of the top plate 134. In the passage 135, the fan 138 faces the heat dissipating portion 126. The motor fan 138 serves to suck in cooling air through an air inlet 139 in the top plate 134 and blow the cooling air directly against the heat dissipating portion 126. After having flowed through the cooling air passage 135, the cooling air is discharged to the outside of the cooling unit 120 through air outlets 140 in the upright wall 133.

In the cooling unit 120 constructed in this manner, heat from the semiconductor package 7 is transferred to the heat receiving portion 125 of the main body 121. By this heat transfer, the refrigerant R at the one end of each refrigerant passage 131 is heated and reduced to vapor, which flows from the heat receiving portion 125 toward the heat dissipating portion 126. The heat dissipating portion 126 is kept at a distance from the package 7, and is hit by the cooling air blown by means of the motor fan 138. Therefore, the temperature and internal pressure of the heat dissipating portion 126 are kept lower than those of the heat receiving portion 125.

Thus, the vapor guided to the heat dissipating portion 126 radiates heat and condenses therein. The heat radiated by this condensation of the refrigerant R is borne by the flow of the cooling air and discharged to the outside of the cooling unit 120.

The refrigerant R that is liquefied by heat exchange in the heat dissipating portion 126 is caused to flow along the respective inner surfaces of the refrigerant passages 131 by capillarity, and returns to the heat receiving portion 125. Then, the refrigerant R is heated and reduced again to vapor by heat from the semiconductor package 7. As the evaporation and condensation of the refrigerant R are repeated, heat from the heat receiving portion 125 is positively transferred to the heat dissipating portion 126.

According to this arrangement, that part of the heat receiving portion 125 of the cooling unit 120 which receives the heat from the semiconductor package 7 is composed of the soft heat conduction sheet 130. The sheet 130 can be deformed and adhere to the package 7 so as to compensate for lowering of the heat conductivity that is attributable to the surface roughness of the package 7 or absorb a gap that hinders heat conduction.

Accordingly, the heat transmitted from the semiconductor package 7 to the heat conduction sheet 130 can be transmitted directly to the refrigerant R in the refrigerant passages 131, and the heat from the package 7 transmitted to the heat receiving portion 125 can be efficiently transferred to the heat dissipating portion 126 by utilizing the refrigerant R.

Thus, the thermal resistance of the heat conduction path that extends from the semiconductor package 7 to the refrigerant R can be lowered, and the efficiency of heat conduction from the package 7 to the refrigerant R can be improved considerably.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cooling unit for cooling a heat generating component comprising:
   a vessel filled with a refrigerant, the vessel including a heat receiving portion for receiving heat from the heat generating component, a heat dissipating portion for dissipating the heat from the heat generating component, and a heat transfer portion for transferring the heat from the heat generating component, transmitted to the heat receiving portion, to the heat dissipating portion via the refrigerant, at least the heat receiving portion of the vessel having a part opposite to the heat generating portion, the part being formed of a soft heat conduction sheet capable of elastic deformation, and the heat receiving portion being fixed to the heat generating component by means of a bracket such that the heat conduction sheet is in thermal contact with the heat generating component; and
   a heat sink connected thermally to the heat dissipating portion.

2. A cooling unit according to claim 1, wherein said vessel has a groove-shaped recess connecting the heat receiving portion and the heat dissipating portion, and said heat conduction sheet covers an open end of the recess and defines a refrigerant passage for the refrigerant in conjunction with the recess.

3. A cooling unit according to claim 1, wherein said heat receiving portion includes at least one projection projecting toward the heat conduction sheet, the distal end of the projection being in contact with the heat conduction sheet.

4. A cooling unit according to claim 1, wherein said heat dissipating portion has a part opposite to the heat sink, the part being formed of a soft heat conduction sheet capable of elastic deformation.

5. A cooling unit for cooling a heat generating component, comprising:
   a heat receiving portion for receiving heat from the heat generating component, the heat receiving portion having a part opposite to the heat generating portion, the part being formed of a soft heat conduction member capable of elastic deformation, and the heat receiving portion being fixed to the heat generating component by means of a bracket such that the heat conduction member is in thermal contact with the heat generating component;
   a heat dissipating portion for dissipating the heat from the heat generating component;
   a heat transfer portion for circulating a refrigerant between the heat receiving portion and the heat dissipating portion and transferring the heat from the heat generating component, transmitted to the heat receiving portion, to the heat dissipating portion via the refrigerant; and
   a heat sink connected thermally to the heat dissipating portion.

6. A cooling unit according to claim 5, wherein said heat transfer portion includes a first pipeline for guiding the refrigerant heated in the heat receiving portion to the heat dissipating portion, a second pipeline for guiding the refrigerant cooled by heat exchange in the heat dissipating portion to the heat receiving portion, and a pump for automatically circulating the refrigerant between the heat receiving portion and the heat dissipating portion.

7. A circuit module comprising:
   a circuit board having a mounting surface;
   a heat generating component mounted on the mounting surface of the circuit board; and
   a cooling unit for cooling the heat generating component, the cooling unit including a heat receiving portion for receiving heat from the heat generating component, a heat dissipating portion for dissipating the heat from the heat generating component, and a heat transfer portion for transferring the heat from the heat generating component, transmitted to the heat receiving portion, to the heat dissipating portion via a refrigerant, the heat receiving portion of the cooling unit having a part opposite the heat generating component, the part being formed of a soft heat conduction sheet capable of elastic deformation, the heat conduction sheet having an outer peripheral portion projecting around the heat generating component, the outer peripheral portion being directly in contact with the mounting surface of the circuit board.

8. A circuit module according to claim 7, wherein said heat receiving portion of said cooling unit is fixed to the circuit board by means of a bracket so that the heat conduction sheet of the heat receiving portion is pressed against the heat generating component and the mounting surface of the circuit board.

9. A circuit module comprising:
   a heat generating component; and
   a cooling unit for cooling the heat generating component, the cooling unit including a heat receiving portion for receiving heat from the heat generating component, a heat dissipating portion for dissipating the heat from the heat generating component, a pipeline for transferring the heat from the heat generating component, transmitted to the heat receiving portion, to the heat dissipating portion via a refrigerant, and a heat sink connected thermally to the heat dissipating portion, the heat receiving portion of the cooling unit being formed of a soft heat conduction pouch capable of elastic deformation and having a socket at one end thereof to which the pipeline is connected, the heat receiving portion being fixed to the heat generating component by means of a bracket so that the heat conduction pouch is flattened between the bracket and the heat generating component and directly in contact with the heat generating component, and the heat dissipating portion of the cooling unit being formed of a soft heat conduction pouch capable of elastic deformation and having a socket at one end thereof to which the pipeline is connected, the heat conduction pouch being directly in contact with the heat sink.

10. An electronic apparatus comprising:
    a housing having a heat generating component therein;
    a cooling unit held in the housing, the cooling unit including a heat receiving portion for receiving heat from the heat generating component, the heat receiving portion having a part opposite to the heat generating component, the part being formed of a soft heat conduction sheet capable of elastic deformation and the heat receiving portion being fixed to the heat generating component by means of a bracket such that the heat conduction sheet is in thermal contact with the heat generating component, a heat dissipating portion for dissipating the heat from the heat generating component, and a heat transfer portion for transferring the heat from the heat generating component, transmitted to the heat receiving portion, to the heat dissipating portion via a refrigerant; and
    a heat sink connected thermally to the heat dissipating portion.

11. An electronic apparatus according to claim 10, wherein the heat dissipating portion has a part opposite to the heat sink, the part being formed of a soft heat conduction sheet capable of elastic deformation.

12. A cooling unit for cooling a heat generating component mounted on a circuit board, the cooling unit comprising:

- a main body having heat conductivity, the main body including a heat receiving portion for receiving heat from the heat generating component and a heat dissipating portion connected thermally to the heat receiving portion, the heat receiving portion and the heat dissipating portion being disposed along the circuit board;
- a fan for supplying cooling air to the heat dissipating portion, the fan being opposite to the heat dissipating portion and adjoining the heat receiving portion; and
- a refrigerant passage in the main body allowing movement of a liquid refrigerant between the heat receiving portion and the heat dissipating portion, the refrigerant passage being capable of transferring the heat from the heat generating component, transmitted to the heat receiving portion, to the heat dissipating portion via the refrigerant,
- wherein at least the heat receiving portion of the main body has a counterpart of the refrigerant passage, the counterpart being formed of a soft heat conduction sheet capable of elastic deformation, the heat conduction sheet being connected thermally to the heat generating component.

13. A cooling unit according to claim 12, wherein said main body has a cooling air passage for the cooling air connected thermally to the refrigerant passage.

* * * * *